United States Patent [19]

Vilasagar

[11] Patent Number: 5,236,990
[45] Date of Patent: Aug. 17, 1993

[54] LOW GLOSS POLYCARBONATE/ABS BLENDS OBTAINED BY USING A HYDROXY FUNCTIONAL RIGID POLYMER

[75] Inventor: Shripathy Vilasagar, Parkersburg, W. Va.

[73] Assignee: General Electric Company, Pittsfield, Mass.

[21] Appl. No.: 843,662

[22] Filed: Feb. 28, 1992

[51] Int. Cl.$^5$ .............. C08L 69/00; C08L 55/02; C08L 25/14
[52] U.S. Cl. ..................... 525/67; 525/148
[58] Field of Search ................. 525/67, 148

[56] References Cited

U.S. PATENT DOCUMENTS

| | | | |
|---|---|---|---|
| 3,914,335 | 10/1975 | Tugukuni et al. | |
| 4,034,013 | 7/1977 | Lane. | |
| 4,317,891 | 3/1982 | Sakano | 525/66 |
| 4,444,950 | 4/1984 | Sakano et al. | 525/67 |
| 4,500,679 | 2/1985 | DuFour | 525/64 |
| 4,554,315 | 11/1985 | Chung et al. | 525/67 |
| 4,569,969 | 2/1986 | Jones et al. | 525/67 |
| 4,607,079 | 8/1986 | Giles | 525/67 |
| 4,739,010 | 4/1988 | McKee et al. | 525/67 |
| 4,742,104 | 5/1988 | Lindner | 525/67 |
| 4,774,286 | 9/1988 | Taubitz et al. | 525/67 |
| 4,782,117 | 11/1988 | Lausberg | 525/433 |
| 4,883,835 | 11/1989 | Buysch | 524/140 |
| 4,886,855 | 12/1989 | Parsons | 525/67 |
| 4,902,743 | 2/1990 | Boutni | 525/148 |

FOREIGN PATENT DOCUMENTS 059258 4/1983 Japan.
311160 12/1989 Japan.

Primary Examiner—David J. Buttner

[57] ABSTRACT

A thermoplastic blend composition is provided containing an aromatic polycarbonate, a graft copolymer and a hydroxy functional rigid polymer such as styrene-acrylonitrilehydroxyalkyl methacrylate terpolymer. The compositions exhibit low gloss and are useful as molding resins.

14 Claims, No Drawings

LOW GLOSS POLYCARBONATE/ABS BLENDS OBTAINED BY USING A HYDROXY FUNCTIONAL RIGID POLYMER

BACKGROUND OF THE INVENTION

1. Field of the Invention

The present invention relates to blends of aromatic polycarbonate resin and rubber modified graft polymer, and more particularly relates to low gloss aromatic polycarbonate/graft copolymer blends containing hydroxy functional rigid polymer.

2. Description of the Related Art

Blends of polycarbonate resin and ABS resin are known, see for example, German Patent 1,170,141 - many polycarbonate resin/ABS resin blends however exhibit high levels of gloss while in various applications it is desired that the blends exhibit low surface gloss.

SUMMARY OF THE INVENTION

The present invention provides low surface gloss polycarbonate/graft copolymer blends. The blends comprise aromatic polycarbonate resin, a graft copolymer which is preferably an ABS resin, and an amount of a hydroxy functional rigid polymer, preferably a styrene-acrylonitrilehydroxyalkyl (meth)acrylate terpolymer, sufficient to reduce the gloss of the blend.

DETAILED DESCRIPTION OF THE INVENTION

The polymer blend compositions of the invention comprise an aromatic polycarbonate resin, a graft copolymer and a hydroxy functional rigid polymer. The blends exhibit a relatively low level of gloss compared to similar blends lacking the hydroxy functional rigid polymer.

The polycarbonate component included in the blend compositions may be any aromatic homopolycarbonate or co-polycarbonate known in the art. The polycarbonate component may be prepared in accordance with any of the processes generally known in the art, for example, by the interfacial polycondensation process, polycondensation in a homogeneous phase or by transesterification. These processes and the associated reactants, polymers, catalysts, solvents and conditions are well known in the art and are described in U.S. Pat. Nos. 2,964,974; 2,970,137; 2,999,835; 2,999,846; 3,028,365; 3,153,008; 3,187,065; 3,215,668; 3,258,414 and 5,010,162, all of which are incorporated herein by reference. Suitable polycarbonates are based, for example, on one or more of the following bisphenols: dihydroxy diphenyls, bis-(hydroxyphenyl)-alkanes, bis-(hydroxyphenyl)-cycloalkanes, bis-(hydroxyphenyl)sulphides, bis-(hydroxyphenyl)ethers, bis-(hydroxyphenyl)-ketones, bis-(hydroxyphenyl)-sulphoxides, bis-(hydroxyphenyl)-sulphones, alkyl cyclohexylidene bisphenols, a,a-nod-(hydroxyphenyl)diisopropyl benzenes, and their nucleus-alkylated and nucleus-halogenated derivatives, and mixtures thereof.

Specific examples of these bisphenols are 4, 4'-dihydroxy diphenyl, 2,4-bis-(4-hydroxyphenyl)propane, 2, 4-bis-(4-hydroxyphenyl)-2-methyl butane, 1, 1-bis-(4-hydroxyphenyl)-cyclohexane, a,a-bis-(4-hydroxyphenyl)-diisopropyl benzene, 2, 2-bis(3-methyl-4-hydroxyphenyl)propane, 2, 2-bis-(3-chloro-4-hydroxyphenyl)propane, 2, 2-bis-(3-chloro-4-hydroxyphenyl)-propane, bis-(3, 5-dimethyl-4-hydroxyphenyl)-methane, 2,2-bis-(3,5-dimethyl-4-hydroxyphenyl)-propane, bis-(3, 5-dimethyl-4-hydroxyphenyl)-sulphone, 2, 4-bis-(3, 5-dimethyl-4-hydroxyphenyl)-2-methyl butane, 1, 1-bis-(3, 5-dimethyl-4-hydroxyphenyl)-cyclohexane, a,a-bis-(3, 5-dichloro-4-hydroxyphenyl)-p-diisopropyl benzene, 2, 2-bis-(3,5-dichloro-4-hydroxyphenyl)-propane and 2, 2-bis-(3, 5-dibromo-4-hydroxyphenyl)-propane. A particular preferred bisphenol is 2, 2-bis-(4-hydroxyphenyl)-propane, more commonly known as bisphenol A. The bisphenols may be reacted with phosgene to produce the aromatic polycarbonates.

The graft copolymer comprises a rigid polymeric portion grafted to a diene rubber substrate. In a preferred embodiment, the rigid graft portion is formed from styrene and acrylonitrile and the diene rubber substrate comprises polybutadiene. Additionally, the graft copolymer may include diene rubbers other than polybutadiene as is well known in the art. It is noted, however, that an ABS graft copolymer comprising a rigid graft polymer comprising styrene and acrylonitrile grafted to a polybutadiene rubber substrate is the preferred graft copolymer. In this preferred embodiment, it is further preferred that the weight ratio of styrene to acrylonitrile in the rigid graft portion of the ABS graft copolymer is in the range of about 1:1 to about 10:1 so that the amount of styrene is equal to or greater than the amount of acrylonitrile included in the graft portion. The graft copolymer may be prepared according to methods also well known in the art, including emulsion, bulk and suspension processes and is preferably made by an emulsion process. As is known in the art, methods of producing ABS resin may result in a product comprising a mixture of ABS graft copolymer and ungrafted styrene-acrylonitrile copolymer. These mixtures are also suitable for use in the invention.

The graft copolymer which is included in the compositions of the invention comprises a rubber substrate and a graft portion grafted to the rubber substrate. The rubber substrate is formed from at least one diene monomer of the formula:

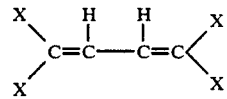

wherein X is selected from the group consisting of hydrogen, alkyl groups containing from 1 to 5 carbon atoms, chlorine and bromine. Examples of the diene monomer include butadiene, isoprene, 1,3-heptadiene, methyl-1, 3-pentadiene, 2-ethyl-1,3-pentadiene, mixtures thereof and the like. Preferably, the diene monomer comprises butadiene, wherein the rubber substrate comprises a polybutadiene substrate. Alternatively, at least one additional styrene monomer may be included in the rubber substrate, thereby forming, for example, a styrene-butadiene rubber substrate. Although the graft copolymer may include the rubber substrate and the graft portion in any ratio which is desired, it is preferred that the graft copolymer comprises rubber substrate at a level of at least 60 weight percent based on the total weight of the graft copolymer, and more preferably at a level of at least 50 weight percent thereof. In a preferred embodiment, the ABS resin comprises from about 30 to about 75 weight percent of the diene rubber substrate based on the total weight of the ABS resin, and more preferably about 60 to about 70 weight percent thereof.

The graft portion of the graft copolymer is preferably formed from at least one vinyl aromatic monomer and at least one additional monomer. The at least one vinyl aromatic monomer may comprise unsubstituted styrene monomer, or substituted styrene monomer, or mixtures thereof. Substituted styrene monomers may include substituents on the aromatic portion and/or the vinyl portion, with preferred substituents being selected from the group consisting of alkyl groups of from 1 to 5 carbon atoms and halogen atoms such as chlorine and bromine. Preferred vinyl aromatic monomers include unsubstituted styrene, alphamethylstyrene, dibromostyrene, and mixtures thereof. The at least one additional monomer which is employed in forming the grafted portion is preferably selected from the group consisting of acrylonitrile, methacrylonitrile, alkyl (meth)acrylates, maleic anhydride, maleimide, alkyl maleimides and aryl maleimides, or mixtures thereof. In a preferred embodiment, the grafted portion is formed from a styrene monomer and acrylonitrile, with the styrene and acrylonitrile being employed in a weight ratio of between 1:1 and 10:1.

The graft copolymer may be formed by any of the methods well known in the art for the formation of ABS graft copolymers. For example, the graft copolymer may be formed by emulsion polymerization wherein the at least one vinyl aromatic monomer and the at least one additional monomer are polymerized in the presence of the rubber substrate. As is well known in the art, such a process often results in the formation of the grafted copolymer and an additional polymer of the at least one vinyl aromatic monomer and the at least one additional monomer, which copolymer does not contain the rubber substrate. Within the terms of the present specification and claims, reference to the graft copolymer includes such mixtures of the graft copolymer and an additional copolymer formed from the grafting monomers. An example of such a copolymer is a copolymer consisting of styrene and acrylonitrile.

The hydroxy functional rigid polymer is based on a hydroxy functional vinyl monomers and a vinyl cyanide monomer, and more preferably are further based on an aromatic vinyl monomer. Suitable hydroxy functional vinyl monomers include allyl alcohol and hydroxy functional esters of carboxylic acids obtained by reacting a carboxylic acid with an alcohol. Suitable carboxylic acids include acrylic, methacrylic, crotonic, maleic, fumaric, haconic and aconitic acids. Suitable alcohols include polyethylene glycol, polypropylene glycol, polybutylene glycol having from 1 to 60 alkyleneoxy repeating units, glycerol, pentaerithritol, cellulose, sorbitan, hydroxyalkyl derivatives thereof, polyvinyl alcohol and polymers and copolymers thereof, vinyl benzyl alcohol, isopropeiryl-benzyl alcohol, vinyl phenol, and isopropenyl phenol. Examples of vinyl cyanide monomer are acrylonitrile and methacrylonitrile. Examples of aromatic vinyl compounds are styrene, alpha methyl styrene, dimethyl styrene and vinyl toluenene. The preferred hydroxy functional monomer is obtained from reacting ethyl alcohol with methacrylic acid to yield hydroxyethylmethacrylate. Examples of hydroxy functional rigid polymers include styrene-acrylonitrile-hydroxyalkyl methacrylate terpolymer and styrene-acrylonitrile-hydroxyalkyl acrylate terpolymer. The vinyl aromatic monomer may be selected from styrene, alpha methyl styrene, chloro-styrene, bromostyrene, p-methyl styrene and vinyl toluene. Preferably the hydroxy functional vinyl monomer is present at a level of from 1 to 25 weight percent based on the total weight of the hydroxy functional rigid polymer. The vinyl cyanide monomer is preferably acrylonitrile or methacrylonitrile and may be replaced in whole or in part by alkyl (meth)acrylates, alkyl maleimides aryl maleimides, etc. The third component thus is a rigid polymer having both hydroxy groups and vinyl groups thereby having both vinyl functionality and hydroxy functionality. The rigid polymer is free of rubbery elements such as 1,3 butadiene rubber.

The hydroxy functional rigid polymer is preferably formed in a polymerization process, such as bulk, suspension, solution or emulsion polymerization process as is well known in the art. In practice, the preparation of the styrene-acrylonitrile-hydroxyethyl methacrylate terpolymer may be controlled to form a product comprising a mixture of the terpolymer and styrene-acrylonitrile copolymer. This mixture may be used in the blends of the present invention.

The preferred hydroxy functional rigid polymer is a styrene-acrylonitrile-hydroxyalkyl (meth)acrylate terpolymer which preferably comprises styrene at a level of from 9 to 90 weight percent based on the total weight of the terpolymer, more preferably from 20 to 85 weight percent thereof, and most preferably from 50 to 80 weight percent thereof; preferably comprises acrylonitrile at a level of from 9 to 90 weight percent based on the total weight of the terpolymer, more preferably from 10 to 60 weight percent thereof, and most preferably 15 to 35 weight percent thereof; and preferably comprise hydroxyalkyl methacrylate at a level of from 1 to 25 weight percent based on the total weight of the terpolymer more preferably from 2 to 15 weight percent thereof and most preferably 3 to 10 weight percent thereof.

The composition of the present invention preferably comprise from 15 to 80 weight percent aromatic polycarbonate based on the total weight of the composition, preferably 30 to 75 weight percent thereof, more preferably 60 to 75 weight percent thereof and most preferably 60 to 70 weight percent thereof; preferably the graft copolymer is present at a level of from 10 to 60 weight percent based on the total weight of the composition; more preferably from 10 to 25 percent by weight thereof; and most preferably from 15 to 20 percent by weight thereof; and preferably the hydroxy functional rigid polymer is present at a level of from 2 to 40 percent by weight based on the total weight of the composition, more preferably from 5 to 30 percent by weight thereof and most preferably 8 to 20 percent by weight thereof. Total rubber content in the composition is preferably at a level of at least 5 percent by weight based on the total weight of the compositions. The compositions may also contain from ABS graft copolymer resin, or as an addition additive, amounts of styrene-acrylonitrile copolymer, for example, from 5 to 40 weight percent based on the total weight of the composition.

The thermoplastic compositions of the invention may be produced according to conventional methods employing conventional mixing and compounding apparatus including, for example, single and twin-screw extruders, mixing rolls and internal mixers. The thermoplastic compositions may also include various conventional additives including, among other, stabilizer, lubricants, flow aids, mod release agents, antioxidants, antistatic agents, fillers, glass fibers, pigments and the like.

The thermoplastic compositions according to the present invention are demonstrated by the following example in which parts and percentages are by weight unless otherwise specified.

| Examples | A | 1 | 2 |
|---|---|---|---|
| Polycarbonate | 64.0 | 64.0 | 64.0 |
| ABS 1 | 16.0 | 16.0 | 16.0 |
| SAN 1 | 20.0 | 5 | 10.0 |
| SAN-HEMA | — | 15 | 10.0 |
| NOTCHED IZOD IMPACT STR (FT-FT/IN), $\frac{1}{8}''$ | | | |
| RT | 13.7 | 13.1 | 13.8 |
| −20° F. | 9.7 | 8.6 | 10.4 |
| −40° F. | 9.1 | 8.8 | 8.3 |
| Gardner Gloss, 60° | 95 | 29 | 29 |

In the example, the polycarbonate is a reaction product of bisphenol-A and phosgene, the ABS 1 is a graft polymer containing styrene-acrylonitrile copolymer grafted on butadiene rubber particles (36 wt% of s, 14 wt% AN, 50 wt% PBD rubber) SAN1 is a stryene-acrylonitrile copolymer 72 wt% S and 28 wt% AN), SAN-HEMA is a terpolymer of styrene, acrylonitrile and hydroxyethyl methacrylate (73 wt% S, 24 wt% AN and 3 wt% HEMA); a phenolic antioxidant sold under the trademark IRGNOX 3114 by B F Goodrich was employed at a level of 0.1 weight percent in examples A, 1 and 2, and a lubricant sold under the trademark GLYCOLUBE P was employed at a level of 1 weight percent in examples A, 1 and 2. Gardner gloss is measured by ASTM D2457.

The blends of examples A, 1 and 2 were compounded at 550° F. and 200 rpm on a 34 mm Leistritz twin screw extruder and then the blends were injection molded at 550° F. with 150° F. mold temperatures.

What is claimed is:

1. A thermoplastic blend composition comprising:
   (a) an aromatic polycarbonate polymer present at a level of from 15 to 80 weight percent based on the total weight of the composition;
   (b) a graft copolymer comprising a rigid polymeric graft portion grafted to a diene rubber substrate, said rigid polymeric graft portion being formed from styrene and acrylonitrile, said graft copolymer being present at a level of from 10 to 60 weight percent based on the total weight of the composition; and
   (C) a hydroxy functional rigid polymer present in an amount sufficient to reduce the gloss of the blend composition, said hydroxy functional rigid polymer being formed from at least one hydroxy functional vinyl monomer, at least one vinyl cyanide monomer and at least one aromatic vinyl monomer, said hydroxy functional rigid polymer being free of rubbery elements.

2. The composition of claim 1 wherein said aromatic polycarbonate polymer is present at a level of from 30 to 75 weight percent based on the total weight of the composition, said graft copolymer being present at a level of from 10 to 25 weight percent based on the total weight of the composition, and said hydroxy functional rigid polymer being present at a level of from 2 to 40 weight percent based on the total weight of the composition.

3. The composition of claim 1 wherein said composition consists of said aromatic polycarbonate polymer, said graft copolymer, and said hydroxy functional rigid polymer.

4. A thermoplastic blend composition consisting essentially of:
   (a) an aromatic polycarbonate polymer present at a level of from 60 to 75 percent by weight based on the entire weight of the composition;
   (b) a graft copolymer consisting essentially of a polybutadiene rubber substrate and a styrene-acrylonitrile copolymer portion grafted thereon, said graft copolymer being present at a level of from 10 to 25 percent by weight based on the entire weight of the composition;
   (c) a styrene-acrylonitrile polymer; and
   (d) a gloss-reducing amount of a hydroxy functional polymer formed from styrene, acrylonitrile and hydroxyethyl methacrylate, said hydroxy functional polymer being present at a level from 5 to 30 percent by weight based on the entire weight of the compositions, said hydroxy functional polymer being free of rubbery elements.

5. A thermoplastic blend composition, comprising:
   (a) an aromatic polycarbonate polymer;
   (b) a graft copolymer comprising a rigid polymeric graft portion grafted to a diene rubber substrate, said rigid polymeric graft portion being formed from styrene and acrylonitrile: and
   (c) a styrene-acrylonitrile-hydroxyalkyl methacrylate terpolymer present in an amount sufficient to reduce the gloss of the blend composition, said terpolymer being free of rubbery elements.

6. A thermoplastic blend composition as defined by claim 5, wherein said aromatic polycarbonate polymer is present at a level of from 15 weight percent to 80 weight percent based on the total weight of the composition, said graft copolymer being present at a level of from 10 to 60 weight percent based on the total weight of said composition, said styrene-acrylonitrile-hydroxyalkyl methacrylate terpolymer being present at a level of from 2 to 40 weight percent based on the total weight of the composition.

7. A thermoplastic blend composition as defined by claim 5, wherein said aromatic polycarbonate polymer is present at a level of from 30 weight percent to 75 weight percent based on the total weight of the composition, said graft copolymer being present at a level of from 10 to 25 weight percent based on the total weight of said composition, said styrene-acrylonitrile-hydroxy methacrylate polymer being present at a level of from 8 to 20 weight percent based on the total weight of the composition.

8. A thermoplastic composition as defined by claim 5 wherein said rubber substrate comprises polybutadiene rubber and said graft portion comprises styrene-acrylonitrile copolymer.

9. A thermoplastic blend composition as defined by claim 5 wherein said graft copolymer consists essentially of a polybutadiene rubber substrate and a styrene-acrylonitrile copolymer portion grafted thereon.

10. The composition of claim 6 further comprising styrene-acrylonitrile polymer.

11. The composition of claim 9 wherein said rubber substrate is present at a level of from 20 to 80 weight percent based on the total weight of the graft copolymer.

12. The composition of claim 9 wherein said aromatic polycarbonate polymer is present at a level of from 30 to 75 weight percent based on the total weight of the composition, said graft copolymer being present at a level of from 10 to 25 weight percent based on the total weight of the composition, said styrene-acrylonitrile-hydroxyalkyl methacrylate polymer being present at a level of from 5 to 20 weight percent based on the total weight of the composition.

13. The composition of claim 5 wherein said styrene-acrylonitrile-hydroxyalkyl methacrylate terpolymer is formed from styrene, acrylonitrile and hydroxyethyl methacrylate, said hydroxyethyl methacrylate being present at a level of from 2 to 25 weight percent based on the total weight of the styrene-acrylonitrile-hydroxyalkyl (meth)acrylate terpolymer.

14. A method for producing a low gloss thermoplastic composition, said method comprising:

(a) melt blending;
   i) a graft copolymer having a rubber substrate,
   ii) an aromatic polycarbonate resin, and
   iii) a rigid polymer having both hydroxy functional groups and vinyl functional groups, said rigid polymer being free of rubbery elements, said rigid polymer being formed from at least one vinyl aromatic monomer, at least one vinyl cyanide monomer, and at least one hydroxy functional vinyl monomer.

* * * * *